United States Patent [19]
Hsieh et al.

[11] Patent Number: 5,202,272
[45] Date of Patent: Apr. 13, 1993

[54] FIELD EFFECT TRANSISTOR FORMED WITH DEEP-SUBMICRON GATE

[75] Inventors: Chang-Ming Hsieh; Louis L. Hsu, both of Fishkill; Shantha A. Kumar, Hopewell Junction, all of N.Y.; Zu-Jean Tien, San Jose, Calif.

[73] Assignee: International Business Machines Corporation, Armonk, N.Y.

[21] Appl. No.: 744,724

[22] Filed: Mar. 25, 1991

[51] Int. Cl.⁵ ............................................. H01L 21/70
[52] U.S. Cl. ........................................ 437/29; 437/40; 437/41; 437/44; 437/228; 437/944
[58] Field of Search .................... 437/29, 40, 41, 44, 437/56, 57, 58, 59, 228, 233, 235, 238, 944; 357/23.3

[56] References Cited

U.S. PATENT DOCUMENTS

| | | | |
|---|---|---|---|
| 4,037,308 | 7/1977 | Smith | 29/571 |
| 4,312,680 | 1/1982 | Hsu | 148/1.5 |
| 4,419,809 | 12/1983 | Riseman et al. | 29/571 |
| 4,502,914 | 3/1985 | Trumpp et al. | 156/643 |
| 4,532,698 | 8/1985 | Fang et al. | 29/571 |
| 4,729,966 | 3/1988 | Koshino et al. | 437/39 |
| 4,803,181 | 2/1989 | Buchamann | 437/228 |
| 4,849,069 | 7/1989 | Evans et al. | 437/228 |
| 4,851,365 | 7/1989 | Jeuch | 437/228 |
| 4,931,137 | 6/1990 | Sibuet | 437/944 |

FOREIGN PATENT DOCUMENTS

| | | |
|---|---|---|
| 57-42151 | 4/1982 | Japan . |
| 63-30773 | 9/1988 | Japan . |
| 0207949 | 8/1989 | Japan . |
| 0222461 | 9/1989 | Japan . |
| 0012836 | 1/1990 | Japan . |

*Primary Examiner*—Tom Thomas
*Attorney, Agent, or Firm*—Jeffrey L. Brandt; Harold Huberfeld

[57] ABSTRACT

A method of forming a semiconductor structure comprising the steps of: providing a body of semiconductor material including at least one generally planar surface; forming a mesa having at least one generally vertical wall over the planar surface; forming a layer of material generally conformally over the mesa and the planar surface so as to form a vertical spacer on the vertical wall; forming a protective mask selectively on the upper portion of the vertical spacer; and using the protective mask to etch and remove the unmasked portions of the layer of material and the mesa while leaving the vertical spacer.

The process is used to form an FET by forming a gate insulating layer underneath of the vertical spacer, the vertical spacer being selected to comprise a conductive gate material such as doped polysilicon. The vertical gate structure is then used as a mask to dope the source and drain regions.

13 Claims, 4 Drawing Sheets

FIELD EFFECT TRANSISTOR FORMED WITH DEEP-SUBMICRON GATE

RELATED CASES

This case is related to U.S. Ser. No. 420,870, filed Dec. 12, 1989.

FIELD OF THE INVENTION

The present invention relates generally to the formation of small-dimensioned features in semiconductor structures and more specifically to the formation of a field-effect transistor including a very narrow, vertical gate structure.

BACKGROUND OF THE INVENTION

In the fabrication and use of field-effect transistors (FETs), it is generally known that short channel lengths yield high performance devices. Conventional photolithography is used in fabrication processes to produce high-performance FETs with submicron, i.e. in the range of 0.8-1.0 micron, channel lengths.

It is further known that FETs having channel lengths in the 0.1 micron range, when operated at very low temperatures (on the order of 77 degrees Kelvin, or lower), provide even better performance. However, with the resolution of conventional photolithography currently limited to about 0.5 micron, no process is known for the reliable, large-scale manufacture of devices incorporating the desirably shorter channel lengths.

Direct write electron beam lithography is capable of providing features in the desired sub-micron range. However, this process is slow, and not adaptable to large-scale manufacturing. X-ray lithography is also capable of providing such high resolution, but comprises a complex, expensive process which is not currently practical for large-scale manufacturing.

Another method of forming sub-micron features is the use of what is termed a "sidewall image transfer" processes. In such a process, a sub-micron sidewall element is used as a mask to transfer, by etching, the sub-micron dimension into underlying materials. See, for example, U.S. Pat. No. 4,502,914 to Trumpp et al. (assigned to the assignee of the present invention), which shows many different sidewall image transfer processes utilizing polymer materials. See also Japanese Kokai 63-307739 (by Fujitsu Ltd.) showing a similar process. Such processes are capable of fabricating features even smaller than those available with conventional photolithography. However, as the feature dimensions approach the 0.1 micron range, the process variations, particularly those related to the etching, are too large to provide the uniformity and reproducibility required for manufacturing.

Yet another method of forming FET devices includes the use of a conductive sidewall as the actual FET gate. See, for example, Japanese Kokai 57-42151 (by Fujitsu K. K.) wherein a polycrystalline sidewall is utilized as an FET gate. U.S. Pat. No. 4,419,809 to Riseman et al. (assigned to the assignee of the present invention) shows a similar process, and further includes the use of additional sidewalls, formed on the sidewall gate, to act as successive masks for dopant implants which control the effective channel length of the completed device. See also U.S. Pat. No. 4,312,680 to Hsu wherein the gate sidewall is formed by lateral diffusion with an etch limiting element from an mesa/source. Selective etching is then used to leave the sidewall.

One problem encountered in the use of such "sidewall gates" as are shown in Fujitsu K. K., Hsu, and Riseman et al. is that of the gates themselves being asymmetrical. More specifically, Fujitsu K. K. and Riseman et al. teach the use of a sidewall gate formed by conformal deposition of a thin, conductive layer, and directional etching whereby to remove horizontal features and leave vertical sidewalls. Hsu teaches doping of the sidewall, followed by selective etching to leave the sidewall. The vertical sidewalls formed by these processes exhibit a characteristic "shoulder," or sloping upper corner, inherently formed by the etching step. This asymmetrical structure of the gate makes it impossible to form symmetrical transistors, resulting in reduced-performance devices.

A further problem encountered in the formation of such sidewall gate structures is that of unequal etching of the surfaces adjoining the gates. More specifically, upon the completion of the etch step used to form the sidewall gates, it is necessary to remove the mesa or form on which the sidewall was formed. The etch used to remove the mesa also removes part of the exposed surface not covered by the mesa and adjoining the sidewall gate. This unevenness in the surfaces adjoining the gate results in an asymmetrical device structure providing less than optimum performance.

No prior art process is known to the present inventors which is suitable in reliability, affordability, and reproducibility for the large-scale fabrication of submicron channel FETs.

SUMMARY OF THE INVENTION

It is an object of the present invention to provide a high-performance FET having a deep sub-micron gate and a symmetrical structure.

It is a further object of the present invention to provide a method of fabricating the above-described FET.

It is another object of the present invention to provide a method for fabricating a sub-micron feature in a semiconductor structure.

In accordance with the present invention, there is provided a method of forming a semiconductor structure comprising the steps of: providing a body of semiconductor material including at least one generally planar surface; forming a mesa having at least one generally vertical wall over the planar surface; forming a layer of material generally conformally over the mesa and the planar surface so as to form a vertical spacer on the vertical wall; forming a protective mask selectively on the upper portion of the vertical spacer; and using the protective mask to etch and remove the unmasked portions of the layer of material and the mesa while leaving the vertical spacer.

In accordance with another embodiment of the present invention, there is provided a method of forming a field-effect transistor comprising the steps of: providing a body of semiconductor material of a first conductivity type having a generally planar surface; forming a mesa including at least one generally vertical surface over the planar surface; forming a layer of insulating material on the planar surface adjoining the mesa; forming a layer of conductive material generally conformally over the mesa and the layer of insulating material, so as to form a vertical gate on the vertical surface over the insulating material; selectively forming a protective mask over the upper portion of the vertical gate; using the protective mask as an etching mask to remove the mesa and horizontal portions of the layer of conductive material to leave the vertical gate standing on the layer of insulating material; and, depositing dopant of a second conductivity type into the planar surface adjoining opposite sides of the vertical gate.

BRIEF DESCRIPTION OF THE DRAWING FIGURES

These and other objects, features, and advantages of the present invention will be apparent through a consideration of the following detailed description of the invention, when considered in conjunction with the drawing Figures, in which.

DETAILED DESCRIPTION OF THE INVENTION

Figure 1:
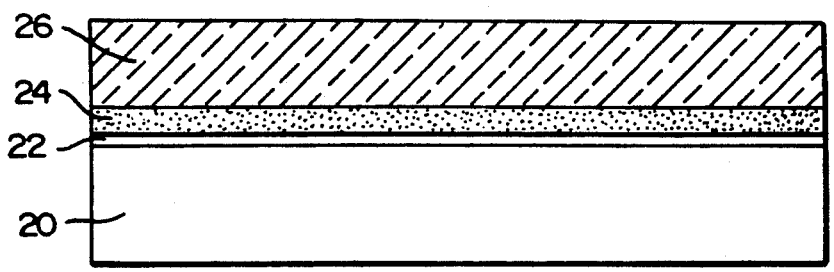
FIGS. 1-9 are cross-sectional views showing consecutive steps in the fabrication of an FET in accordance with the present invention.

Referring now to FIG. 1, a P conductivity type substrate 20 is provided having a generally planar upper surface, sheet resistivity in the range of 1-2 ohm-cm and a crystal orientation, for example, of <100>. Boron ions (not shown) are preferably implanted into the upper surface of substrate 20 at doses in the range of $2-5 \times 10^{12}$ atoms/cm$^2$, to control threshold voltage and inhibit punch-through. When used, such boron ion implants are preferably performed at two implant energies: 17 and 35 KeV.

Continuing to describe FIG. 1, a layer 22 of silicon dioxide is formed conformally over the upper surface of substrate 20 by a process of thermal oxidation to a thickness of in the range of 3-5 nm. A layer 24 of polycrystalline silicon (polysilicon) is formed conformally over oxide layer 22 by a conventional process of chemical vapor deposition (CVD) to a thickness of about 150 nm. Polysilicon layer 24 is formed in situ doped or subsequently doped by ion implantation to a concentration in the range of $1-5 \times 10^{20}$ atoms/cm$^3$. A layer 26 of silicon nitride is formed conformally over polysilicon layer 24, by a conventional process of plasma-enhanced CVD (PECVD) to a thickness of about 300 nm. Alternatively, layer 26 can comprise CVD oxide, for example tetraethylorthosilicate (TEOS), of the same thickness.

Figure 2:
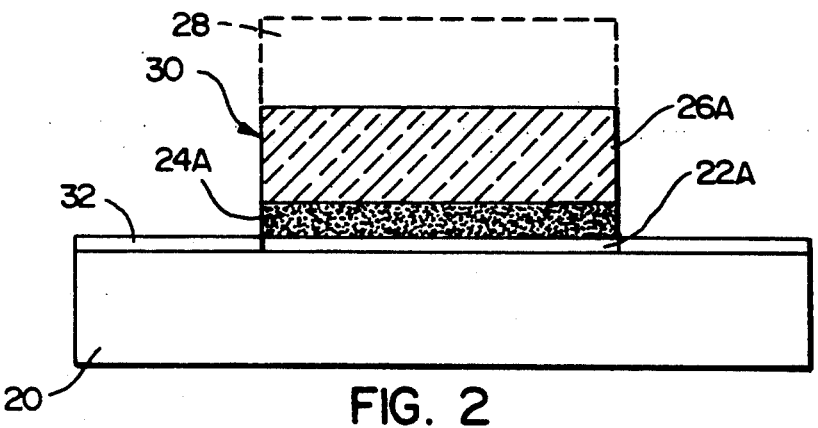

Referring now to FIG. 2, a conventional photolithographic process is used to form a pattern mask 28 of multi-layer photoresist material. Mask 28 is then used to form a generally rectangular mesa 30 comprising consecutive layer portions of oxide 22A, polysilicon 24A, and nitride 26A. More specifically, mask 28 is used with consecutive, anisotropic, reactive ion etching (RIE) processes, using CF$_4$ plasma to remove the unmasked portions of nitride layer 26, SF$_6$/Cl$_2$ plasma to remove the unmasked portions of polysilicon layer 24, and CF$_4$/O$_2$ plasma to remove the unmasked portions of oxide layer 22. Mesa 30 is seen to have substantially vertical sidewalls.

Continuing with reference to FIG. 2, mask 28 is removed in a conventional manner. The structure is subjected to a cleaning operation using BHF, and a thin layer of gate oxide 32 is formed on the exposed surface of substrate 20. Gate oxide 32 is formed using a conventional thermal oxidation process, and to a thickness in the range of 3-5 nm.

Figure 3:
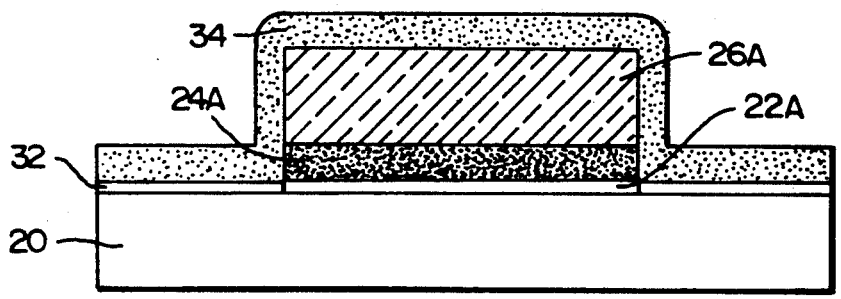

Referring now to FIG. 3, a layer 34 N-type of polysilicon is deposited conformally over the structure, using a conventional process of CVD, and to a thickness of about 150 nm. Polysilicon layer 34 can be formed in situ doped, or subsequently doped by ion implantation, to a dopant concentration in the range of $1-5 \times 10^{20}$ atoms/cm$^3$.

Figure 4:
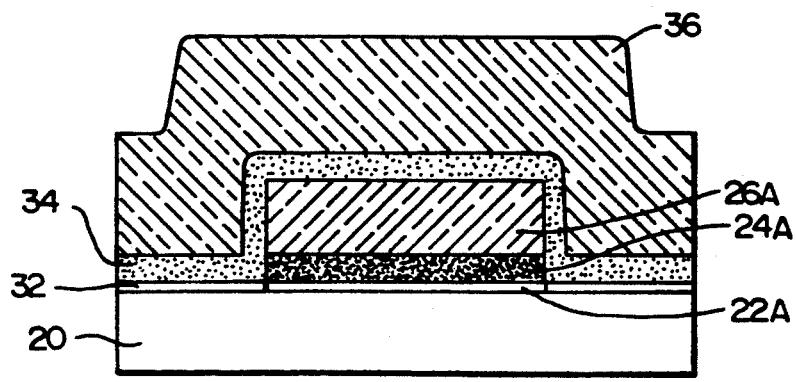
Figure 5:
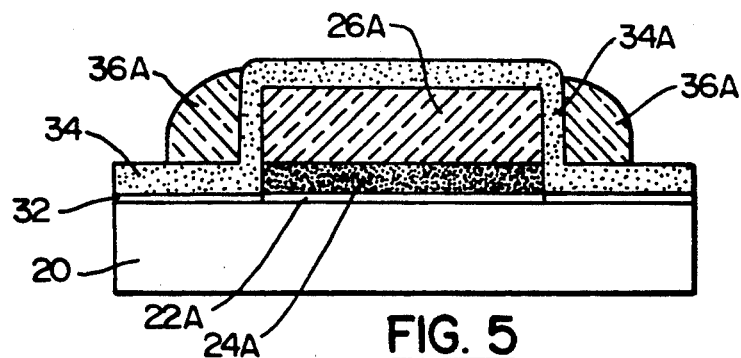

Referring now to FIG. 4, a layer 36 of silicon nitride is formed conformally over the structure, using a conventional PECVD process, to a thickness of about 300 nm. As shown in FIG. 5, layer 36 is subjected to an anisotropic RIE process, using CF$_4$/O$_2$ plasma, to remove horizontal portions of the layer, leaving sidewall spacer 36A adjoining the vertical walls of polysilicon layer 34.

Figure 6:
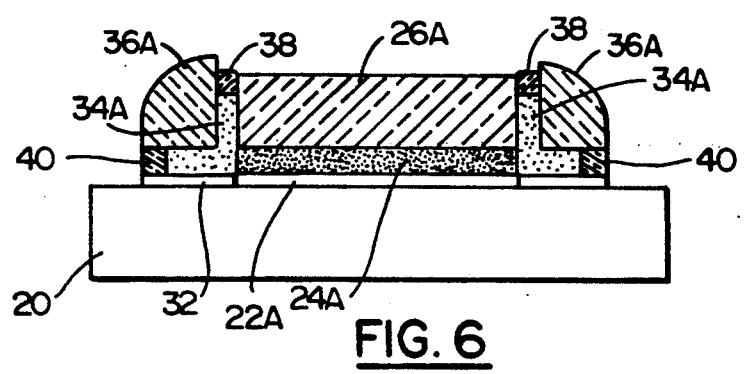

Referring now to FIG. 6, the exposed portions of layer 34, that is those portions not masked by spacer 36A, are subjected to an anisotropic RIE process, using SF$_6$/Cl$_2$, stopping on oxide layer 32, to selectively etch layer 34 and leave L-shaped wall region 34A. The structure is then subjected to a thermal oxidation environment so as to oxidize cap regions 38 and 40 on the upper and lower exposed surfaces of polysilicon wall 34A, respectively. These oxide caps are formed to a thickness of about 100 nm. Layer 32 protects the surface of substrate 20 from further oxidation.

In accordance with a key feature of the present invention, spacer 36A and nitride layer portion 26A are of generally equal vertical thicknesses. The bottom L-leg of polysilicon wall 34A is generally of equal thickness as polysilicon layer portion 24A. Similarly, gate oxide 32 is of generally equal thickness as oxide layer portion 22A. Thus, as these corresponding layers of like materials are simultaneously etched, the underlying surfaces of substrate 20 adjoining the subsequently formed FET gate (described below) are not over-etched so as to be asymmetrical. This symmetry of the surfaces adjoining the gate is an important advantage of the present invention.

More specifically, the multilayer stack consisting of spacer 36A, the bottom L-leg of sidewall 34A, and the underlying portion of oxide layer 32, will etch (as described below) at substantially the identical rates as corresponding layers 26A, 24A, and 32 (below 24A). The bottom L-leg of sidewall 34A extends laterally about 300 nm (the thickness of spacer 36A) from what will become the gate structure of the FET, ensuring that the topography of substrate 20 in the active region of the subsequently formed FET will be symmetrically flat.

Figure 7:
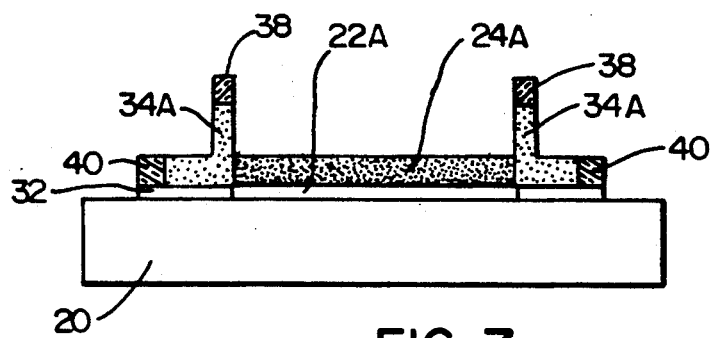

Referring now to FIG. 7, the device is subjected to a wet etch, using H$_3$PO$_4$ acid at 170 degrees centigrade, to simultaneously remove nitride spacer 36A and nitride layer portion 26A from mesa 30.

The structure is then subjected to an anisotropic RIE process, using SF$_6$/Cl$_2$, with oxide cap 38 functioning as a mask, to simultaneously remove the polysilicon bottom L-leg of wall 34A, and polysilicon layer portion 24A from mesa 30. An anisotropic RIE process, using a CF$_4$ plasma, is then used to simultaneously remove caps 38 and 40, the exposed portion of gate oxide layer 32 (i.e. that portion not under the remaining vertical portion of wall 34A), and oxide layer portion 22A.

Figure 8:
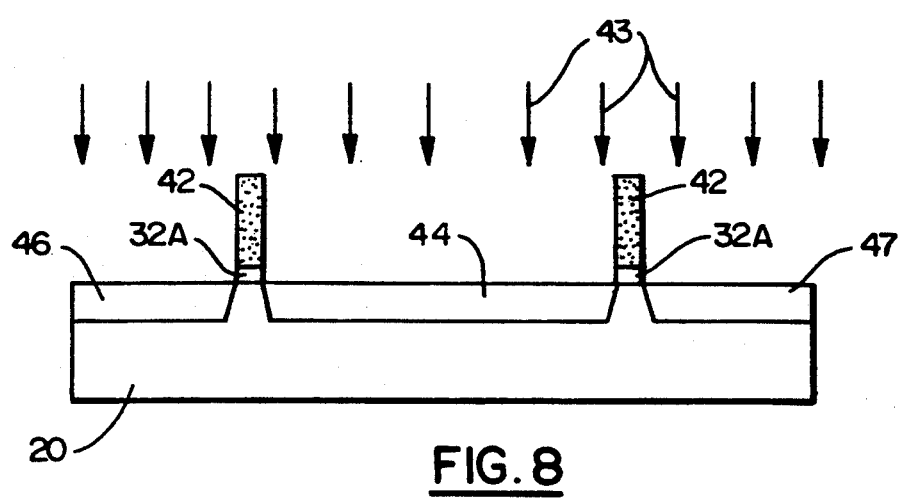

The result of these last-described etching processes, as shown in FIG. 8, is the stand-alone, vertical gate 42 spaced from the upper, major, planar surface of substrate 20 by remaining gate oxide 32A. It will be understood that, because mesa 30 (FIGS. 2–6) is rectangular in nature, gate 42 circumscribes the outline of a rectangle. (See FIG. 14 below.)

In accordance with another key feature of the present invention, it is seen that, when vertical gate structure 42 is formed in accordance with the present invention, it is squared-off at its upper surface. That is, it does not have the characteristic sidewall shoulder described with respect to the background art shown and discussed above. This feature contributes in providing the current invention with the significant advantage of an FET (described below) of highly symmetric structure. This symmetric structure yields a high-performance device.

Continuing to describe FIG. 8, Sb ions are implanted (shown schematically by arrows 43) into the surface of substrate 1 at a power in the range of 10 KeV and a dose in the range of $1-2 \times 10^{14}$ atoms/cm$^3$. N+ source/drain regions 44 (inside sidewall 42), 46 (to the left of the sidewall), and 47 (to the right of the sidewall) are thus formed to a peak concentration in the range of $1-5 \times 10^{20}$ atoms/cm$^3$. This first ion implantation is formed with relatively heavy ions to define the effective channel length of the to-be-completed FETs.

Figure 9:
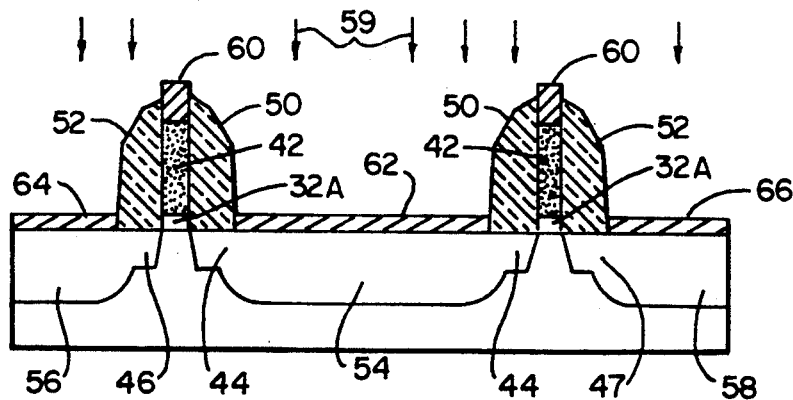

Referring now to FIG. 9, insulating sidewalls 50 and 52 are formed on opposite sides of vertical gate 42 (and gate oxide 32A). Sidewalls 50, 52, comprising, for example, silicon dioxide, silicon nitride, or multiple layers thereof, are formed by the conventional method of conformal deposition followed by anisotropic etching to remove horizontal layer portions and leave the sidewall spacers.

Continuing to describe FIG. 9, a second ion implantation is performed to form N+ regions 54 (inside sidewall 50), 56 (to the left of sidewall 52), and 58 (to the right of sidewall 52). This second ion implant comprises Arsenic ions 59 implanted at an energy of about 20 KeV and a dosage in the range of $2-5 \times 10^{15}$ atoms/cm$^2$. Regions 54, 56 thus have a peak dopant concentration in the range of $1-5 \times 10^{21}$ atoms/cm$^3$.

The device is subjected to a conventional thermal anneal. The device is then subjected to a conventional silicide process so as to form silicide contact 60 on vertical gate 42, and silicide contacts 62, 64, and 66 over doped regions 54, 56, and 58, respectively.

Figure 14:
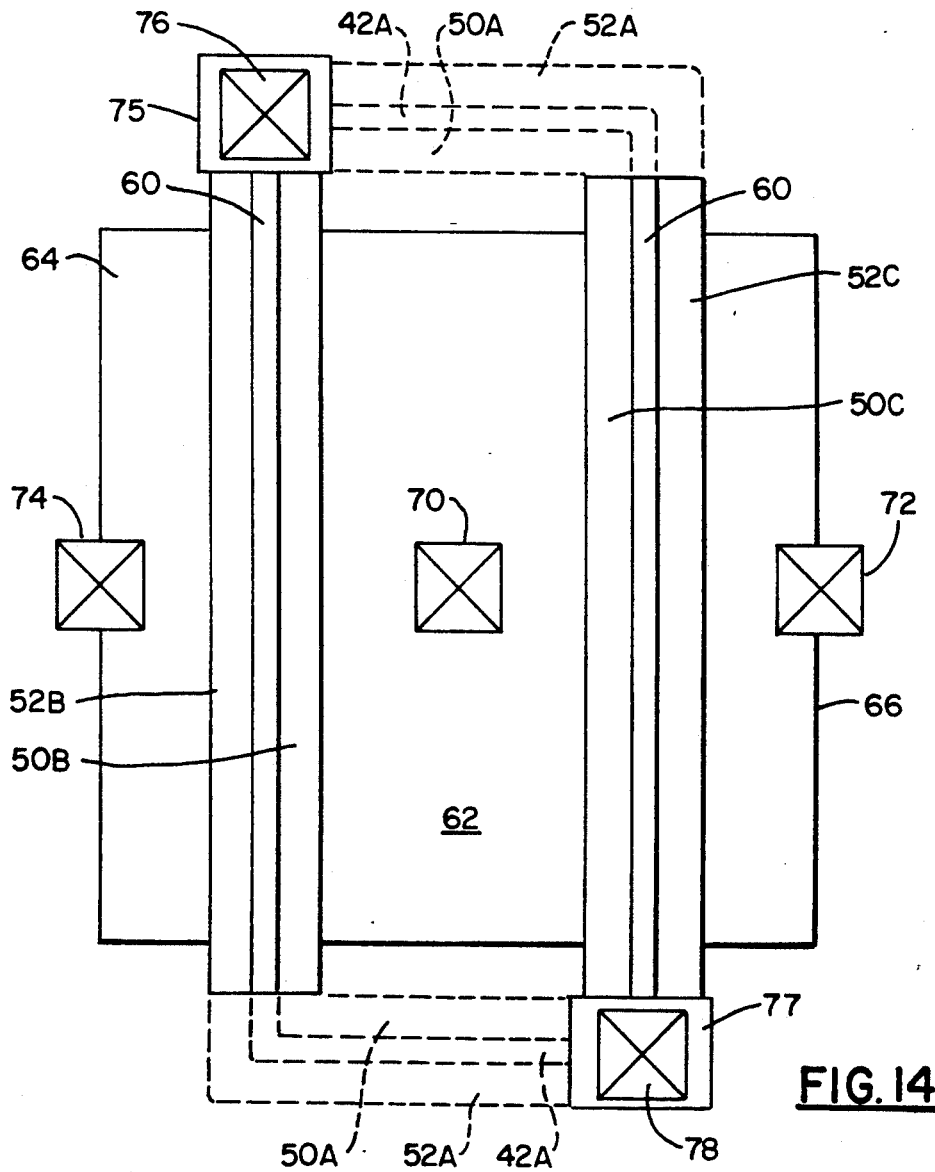
FIG. 14 is a top view of the FET structure shown in FIG. 9 with lateral gate edges removed (as described below).

Referring now also to FIG. 14, the parallel, lateral edges of vertical gate 42 and sidewalls 50, 52 are removed by etching, these removed areas being shown in dotted line as 42A, 50A, 52A, respectively. With the lateral edges of gate 42 removed, there remain two gate structures, a left-most gate structure including a silicide cap 60 over a sidewall 42 (not visible in FIG. 14), and sidewalls 50B, 52B; and a right-most gate structure including a silicide cap 60 over a sidewall 42 (not visible in FIG. 14), and sidewalls 50C, 52C. There are thus formed two FET devices sharing a common source/drain region 54: a first FET having drain region 56, left-most gate 42, and source 54, and a second FET having source 54, right-most gate 42, and drain 58. Source contact 70, drain contact 72, and drain contact 74 are provided to regions 54, 58, and 56, respectively, by patterning and etching overlying oxide regions (not shown), and depositing these metal contacts in a conventional manner. Conductive landing pad 75 and metal contact 76 are provided in a conventional manner for making electrical contact to left-most gate 42/silicide 60. Similarly, conductive landing pad 77 and metal contact 78 are provided for making electrical contact to right-most gate 42/silicide 60.

Referring now to FIGS. 10–13, alternate, low-temperature process steps are illustrated for the corresponding process steps shown in FIGS. 4–7. Like features are indicated by like reference numbers.

Figure 10:
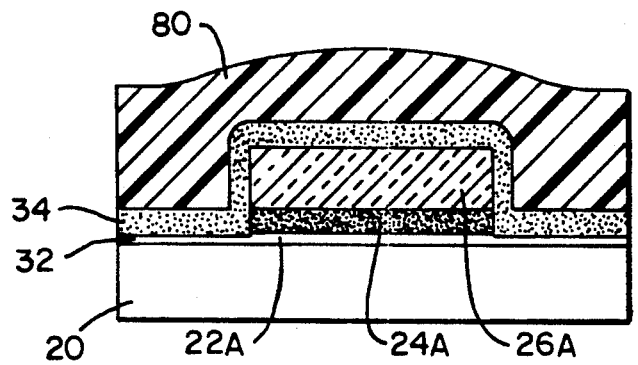
FIGS. 10-13 are cross-sectional views showing consecutive, alternate steps for FIGS. 4-7, respectively, in accordance with an alternate embodiment of the present invention.
Figure 11:
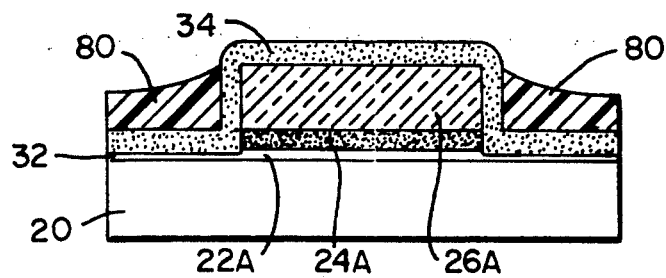

Describing first FIG. 10, a layer 80 of polyimide is spin-coat deposited over layer 34 to a peak thickness of about 1.0 micrometer, and baked at 400 degrees centigrade. This structure is then subjected to an etch-back, using a RIE etch such as O$_2$ plasma, to expose the upper surface of polysilicon layer 34 (over mesa 30), yielding the structure shown in FIG. 11.

Figure 12:
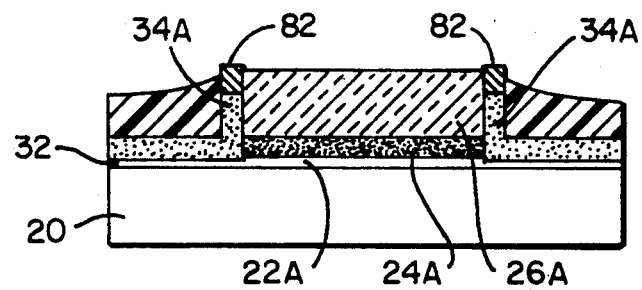

Referring next to FIG. 12, the exposed surface of polysilicon layer 34 is removed using the same process described above with respect to FIG. 6. In contrast to the oxidation step described with respect to FIG. 6, the exposed, upper edges of wall 34A are coated with tungsten (W) 82, using a conventional, selective W deposition process. Such a process is typically performed at a temperature in the range of 300–400 degrees centigrade.

Figure 13:
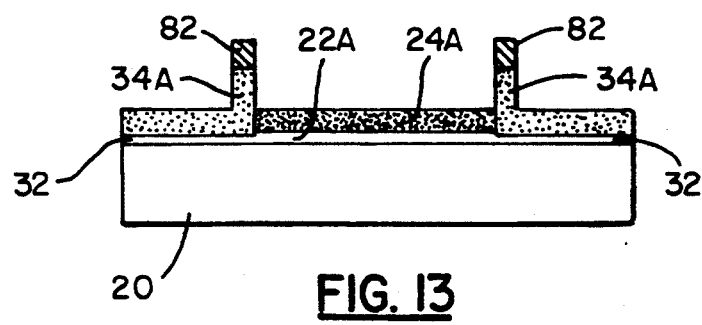

With reference to FIG. 13, the remaining exposed portions of polyimide layer 80 are removed using an O$_2$ ash process. Using tungsten cap 82 as a mask, exposed nitride layer portion 26A is removed with a RIE process, using CF$_4$ plasma.

To provide the structure shown in FIG. 8, tungsten cap 82 is used as a mask, while the exposed polysilicon in layers 24A and 34A (i.e. the unmasked, horizontal portions of these layers) is removed as described with respect to FIG. 8 above. Tungsten cap 82 is again used as a mask to remove the exposed, horizontal portions of oxide in layers 22A and 32, also as described with respect to FIG. 8, above. Finally, tungsten cap 82 is removed using a wet etch of NH$_4$OH/H$_2$O$_2$. The resulting structure is substantially identical to that shown in FIG. 8, and processing is continued in a manner identical to the steps described with respect to FIGS. 8, 9 and 14, above. (Alternatively, tungsten cap 82 can be left in place to lower the resistance of the subsequently formed gate structure. Processing is otherwise continued in an identical manner to that described with respect to FIGS. 8, 9, and 14.)

The process steps described with respect to FIGS. 4–7 require the formation of oxide caps 38, 40, typically at a temperature in the range of 750–900 degrees centigrade. In contrast, the process steps described in this alternate embodiment of the invention (i.e. steps 10–13) use instead tungsten cap 82, formed at a temperature of about 400 degrees centigrade. These alternate steps thus yield the advantage of providing a relatively lower-temperature process.

There is thus provided a method for forming a high-performance FET transistor having a deep sub-micron dimension gate, the gate being formed by a unique process for forming a deep sub-micron dimension semiconductor structure. This process for forming the sub-micron gate yields a highly symmetric, vertically oriented gate, having a square upper surface instead of the characteristic, asymmetrical sidewall shoulder of the background art. Further, this sub-micron vertical gate is formed in a manner so as to avoid damaging the adjoining substrate surfaces, providing planar surfaces for the active source and drain regions. The vertical gate structure is limited in thickness only by the conformal layer deposition process used to form layer 34 (see FIG. 3). The resulting FET structure is highly symmetrical, yielding high-performance operation.

The present invention is useful in the formation of high-performance field-effect transistors, and particularly in the formation of very-large scale integration (VLSI) circuits incorporating such transistors.

While the present invention has been shown and described with respect to preferred embodiments, it is not thus limited. Numerous modifications, changes, and improvements will occur to those skilled in the art that fall within the spirit and scope of the present invention.

What is claimed is:

1. A method of forming a semiconductor structure comprising the steps of:
    providing a body of semiconductor material including at least one planar surface;
    forming a mesa having at least one vertical wall over said planar surface;
    forming a layer of material conformally over said mesa and said planar surface so as to form a vertical spacer on said vertical wall;
    forming a protective mask selectively on the upper portion of said vertical spacer; and
    using said protective mask to etch and remove the unmasked portions of said layer of material and said mesa while leaving said vertical spacer.

2. A method in accordance with claim 1 wherein said step of forming a protective mask includes the steps of:
    forming a second mask adjoining said vertical spacer; and
    using said second mask to selectively etch portions of said layer of material to expose the upper portion of said vertical spacer.

3. A method in accordance with claim 2 wherein:
    said second mask comprises silicon nitride; and
    said protective mask comprises silicon dioxide.

4. A method in accordance with claim 2 wherein:
    said second mask comprises polyimide; and
    said protective mask comprises tungsten.

5. A method in accordance with claim 2 wherein said mesa includes:
    a first mesa layer of a material having an etch characteristic similar to that of said layer of material and a thickness equal to that of said layer of material; and
    a second mesa layer of a material having an etch characteristic similar to that of said second mask and a thickness equal to that of said second mask.

6. A method in accordance with claim 5 and wherein said step of removing said mesa includes the steps of:
    simultaneously removing said second mesa layer and said second mask to expose said first mesa layer and remaining horizontal portions of said layer of material; and
    using said protective mask to simultaneously etch said first mesa layer and said remaining horizontal portions of said layer of material.

7. A method in accordance with claim 6 wherein said mesa comprises:
    a first mesa layer of the same material as and the same thickness as said layer of insulating material;
    a second mesa layer of the same material as and the same thickness as said layer of conductive material; and
    a third mesa layer having a different etch characteristic than said second mesa layer.

8. A method in accordance with claim 7 wherein said step of forming said protective mask includes the steps of:
    forming a second mask of the same material as and the same thickness as said third mesa layer adjoining said vertical gate;
    removing exposed regions of said layer of conductive material to leave said vertical gate sandwiched between said second mask and said mesa with the upper surface of said vertical gate exposed therebetween; and
    forming said protective mask on the exposed upper surface of said vertical gate.

9. A method in accordance with claim 8 wherein:
    said second mask comprises silicon nitride; and
    said protective mask comprises silicon dioxide.

10. A method in accordance with claim 8 wherein said second mask comprises polyimide and said protective mask comprises tungsten.

11. A method in accordance with claim 8 wherein said step of removing said mesa further includes the steps of:
    simultaneously etching to remove said second mask and said third mesa layer;
    simultaneously etching to remove horizontal portions of said conductive layer and said second mesa layer; and
    simultaneously etching to remove exposed portions of said insulating layer and said first mesa layer.

12. A method of forming a field-effect transistor comprising the steps of:
    providing a body of semiconductor material of a first conductivity type having a planar surface;
    forming a mesas including at least one vertical surface over said planar surface;
    forming a layer of insulating material on said planar surface adjoining said mesa;
    forming a layer of conductive material conformally over said mesa and said layer of insulating material, so as to form a vertical gate on said vertical surface over said insulating material;
    selectively forming a protective mask over the upper portion of said vertical gate;
    using said protective mask as an etching mask to remove said mesa and horizontal portions of said layer of conductive material to leave said vertical gate standing on said layer of insulating material; and
    depositing dopant of a second conductivity type into said planar surface adjoining opposite sides of said vertical gate.

13. A method in accordance with claim 12 and further including the steps of:
    forming spacers of insulating material on the vertical surfaces of said vertical gate; and
    depositing dopant of a second conductivity type in said planar surface on opposite sides of said spacers.

* * * * *